United States Patent
Sofin

(10) Patent No.: US 9,382,617 B2
(45) Date of Patent: Jul. 5, 2016

(54) ROD-TYPE POLYSILICON HAVING IMPROVED BREAKING PROPERTIES

(75) Inventor: Mikhail Sofin, Burghausen (DE)

(73) Assignee: Wacker Chemie AG, Munich (DE)

( * ) Notice: Subject to any disclaimer, the term of this patent is extended or adjusted under 35 U.S.C. 154(b) by 1272 days.

(21) Appl. No.: 12/878,085

(22) Filed: Sep. 9, 2010

(65) Prior Publication Data

US 2011/0070439 A1    Mar. 24, 2011

(30) Foreign Application Priority Data

Sep. 24, 2009    (DE) .......................... 10 2009 044 991

(51) Int. Cl.
| | | |
|---|---|---|
| *B32B 5/00* | (2006.01) | |
| *C01B 33/02* | (2006.01) | |
| *C30B 29/06* | (2006.01) | |
| *C23C 16/24* | (2006.01) | |
| *C01B 33/035* | (2006.01) | |
| *C23C 16/56* | (2006.01) | |

(52) U.S. Cl.
CPC ............... *C23C 16/24* (2013.01); *C01B 33/035* (2013.01); *C23C 16/56* (2013.01); *Y10T 428/298* (2015.01)

(58) Field of Classification Search
USPC ................................................ 423/348–350
See application file for complete search history.

(56) References Cited

U.S. PATENT DOCUMENTS

| | | | |
|---|---|---|---|
| 5,593,465 A | 1/1997 | Seifert | |
| 5,976,481 A | 11/1999 | Kubota | |
| 6,365,225 B1 * | 4/2002 | Chandra et al. | ............... 427/237 |
| 6,639,192 B2 | 10/2003 | Hertlein | |
| 6,874,713 B2 * | 4/2005 | Arvidson et al. | .................. 241/1 |
| 7,080,742 B2 | 7/2006 | Arvidson et al. | |
| 2009/0056504 A1 * | 3/2009 | Atsumi et al. | .................... 81/20 |
| 2010/0219380 A1 * | 9/2010 | Hertlein et al. | ............... 252/500 |

FOREIGN PATENT DOCUMENTS

| | | |
|---|---|---|
| DE | 4223458 A1 | 1/1994 |
| DE | 102007047210 A1 | 4/2009 |
| EP | 0329163 A2 | 8/1989 |
| EP | 1391252 A1 | 2/2004 |
| JP | 1249618 A | 10/1989 |
| JP | 200491321 A | 3/2004 |
| JP | 2005288332 A | 10/2005 |
| JP | 2006089353 A | 4/2006 |
| JP | 2010180078 A | 9/2010 |
| WO | WO 2009047107 A2 * | 4/2009 |

* cited by examiner

*Primary Examiner* — Jennifer Chriss
*Assistant Examiner* — Ricardo E Lopez
(74) *Attorney, Agent, or Firm* — Brooks Kushman P.C.

(57) ABSTRACT

Rod-type, polycrystalline silicon having a rod diameter of >100 mm are obtained by deposition of silicon-containing gas according to the Siemens method, wherein the Si rods are brought into contact with hydrogen at the end of the deposition process during cooling in the reactor, and the cooled Si rods obtained have in perpendicular cross section cracks and/or radial stresses having a defined size.

13 Claims, 1 Drawing Sheet

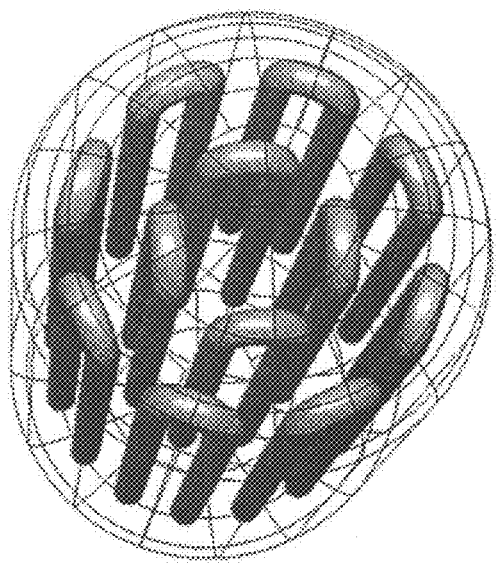

ROD-TYPE POLYSILICON HAVING IMPROVED BREAKING PROPERTIES

CROSS-REFERENCE TO RELATED APPLICATIONS

This application claims priority to German Patent Application No. 10 2009 044 991.4 filed Sep. 24, 2009 which is herein incorporated by reference.

BACKGROUND OF THE INVENTION

1. Field of the Invention

The invention relates to rod-type polysilicon having improved breaking properties, obtained according to the Siemens deposition method.

2. Background Art

Polycrystalline silicon (polysilicon) serves as a starting material for producing monocrystalline silicon for semiconductors according to the Czochralski or floating zone method, and also for producing mono- or multicrystalline silicon according to various pulling and casting methods for the production of solar cells for photovoltaics.

In this case, the polysilicon is principally produced by deposition using trichlorosilane according to the so-called Siemens method. In this method, in a bell-shaped reactor, the so-called "Siemens reactor", thin filament rods composed of silicon are heated by direct passage of current and brought into contact with a reaction gas composed of hydrogen and one or more silicon-containing components. In this case, a preferred raw material is trichlorosilane ($SiHCl_3$) or a mixture thereof with dichlorosilane ($SiH_2Cl_2$).

The filament rods are inserted perpendicularly in electrodes which are situated on the base of the reactor and via which the connection to the power supply is effected. High-purity polysilicon deposits on the heated filament rods and on the horizontal bridge that respectively connects two rods, as a result of which the rod diameter increases with time.

After the desired diameter has been attained, the further addition of Si-containing components ceases. The reactor is subsequently purged in order to remove all gaseous reaction products and the residues of the Si-containing components. The purging is generally effected either using hydrogen or using an inert gas such as nitrogen or argon. After purging, the inflow of the purging gas is stopped and the supply of energy is reduced, either abruptly or with a specific ramp to zero, and the resulting Si rods cool then to the ambient temperature.

After the rods have cooled and if the purging was not effected using inert gas, hydrogen in the reactor bell is replaced by an inert gas, the deposition reactor is opened and the carrier bodies with the polysilicon rods are removed from the reactor.

For various uses of the polysilicon rods it is then necessary to break the rods into small pieces in a subsequent step. Si rods produced according to the conventional Siemens method are very hard and therefore require high forces to break them apart. This has the effect that, during the corresponding breaking method, Si fragments on the surface are significantly contaminated with material of breaking tools. Moreover, after a breaking, the intention is for as many Si fragments as possible to be in a preselected size range. The process of breaking Si rods according to the prior art gives rise to many fragments which do not correspond to the desired size and, consequently, have to be sold at significantly reduced prices.

EP 0329163 describes a method for improving the breaking properties of polysilicon wherein the Si rods, after deposition, are once again heated and quenched or subjected to a compression wave in an aftertreatment. However, this method is associated with very high technical complexity, high costs, and risk of contamination.

During the production of thick polycrystalline Si rods it can relatively often be observed that they tilt from the mounts and fall over during the cooling phase in the reactor after the deposition. This phenomenon delays the production process considerably, since the rods that have fallen over can only be removed from the reactor with additional complexity. Furthermore, this also gives rise to high financial damage since tilted or collapsed Si rods can no longer be processed further as envisaged. The financial damage is particularly high in the production of polysilicon for the solar industry, because this material is normally used without additional cleaning steps. Rods that have fallen over subsequently have to be subjected to complex cleaning, which makes the solar material significantly more expensive.

U.S. Pat. No. 5,593,465 discloses arranging at least one spring element between the current feed and the electrode holder, the spring element permitting a movement of the electrode holder relative to the current feed and cushioning this movement. This arrangement is intended to minimize tilting and falling of the Si rods. What is disadvantageous about this solution, however, is the high technical complexity and the considerable costs associated therewith.

U.S. Pat. No. 6,639,192 recommends the use of carbon electrodes having a high thermal conductivity in order to prevent the rods from falling over in the reactor. This solution has the serious disadvantage, however, that, owing to the high thermal conductivity of carbon electrodes, the latter are not overgrown or are overgrown only little by the silicon during the deposition process. This has the effect that the rods can easily fall over as early as at the beginning of the deposition.

SUMMARY OF THE INVENTION

An object of the present invention is to provide polycrystalline silicon rods having a large diameter (>100 mm) composed of high-purity silicon for applications in the semiconductor industry and also in the solar industry for various pulling and casting methods for the production of solar cells for photovoltaics, which have an improved breaking behavior in order to significantly reduce the associated contamination of Si fragments and to reduce the proportion of silicon fragments having undesired sizes. A further aim of the invention is to reduce the production costs of the polycrystalline silicon rods by preventing the rods from falling over during the cooling phase. It has surprisingly been found that polycrystalline silicon rods, by means of a specific withdrawal process with addition of hydrogen at the end of the deposition according to the Siemens method, acquire defined cracks and stresses and can thus be broken into pieces more easily in subsequent further processing. A further surprising advantage of the aftertreatment according to the invention is the reduction of the proportion of rods which fall over in the reactor.

DETAILED DESCRIPTION OF THE PREFERRED EMBODIMENT(S)

The invention thus relates to rod-type, polycrystalline silicon having a rod diameter of >100 mm, obtained by deposition of silicon-containing gas according to the Siemens method, wherein the Si rods are brought into contact with hydrogen at the end of the deposition process during cooling in the reactor, wherein the hydrogen flow rate and/or the hydrogen pressure is selected such that the power required in the case of the selected flow rate and/or pressure for maintaining the deposition temperature is at least 50% of the power at the end of deposition, but not less than 5 kW per 1 m rod length, and the cooled Si rods have in perpendicular cross section cracks and/or radial stresses having a size of at least $1 \cdot 10^{-4}$ cm$^{-1}$.

The inventive rod-type, polycrystalline silicon having a rod diameter of >100 mm arises by virtue of the fact that, during the cooling of the Si rods, a high quantity of hydrogen is introduced into the reactor and/or the pressure in the reactor is raised. In this case, the hydrogen is preferred to be present during the phase of reducing the temperature from the deposition temperature to the ambient temperature. The application of hydrogen can also already be ended at higher temperatures than the ambient temperature, but it has to be maintained at least to a rod temperature of 800° C.

The hydrogen flow rate and/or the pressure must be chosen such that the power required in the case of the selected flow rate and pressure for maintaining the deposition temperature is at least 50% of the power at the end of deposition, but not less than 5 kW per 1 m rod length.

In this case, preference is given to a pressure in the reactor of between 2 and 30 bar, more preferably between 3 and 20 bar. The hydrogen flow rate is preferably between 2 and 100 Nm$^3$/h per 1 m rod length, more preferably between 5 and 50 Nm$^3$/h per rod length.

This procedure has the effect that Si rods are highly strained and acquire many cracks during cooling. As a result, the Si rods can be broken very easily in the further processing, such that the Si fragments are contaminated only very little by the abrasion of the breaking tools used. A further advantage is that the proportion of lower-quality small silicon fragments is reduced.

If the cross sections of the Si rods are considered in a perpendicular direction with respect to the thin rod, then at least 80% of the cross sections have cracks and/or radial stresses larger than $1 \cdot 10^{-4}$ cm$^{-1}$. These cracks in the polycrystalline Si rods can be detected visually or by means of known methods such as, for example, sound testing, dye penetration testing or ultrasonic technology. A method for measuring mechanical stresses in polycrystalline rods is described, by way of example, in U.S. Pat. No. 5,976,481.

In the case of breaking compact polycrystalline Si rods, fragments having a size in the range of 50 to 100 mm are preferred for most applications. In the case of conventional Si rods, a maximum proportion by weight of 65% of fragments of the target size, relative to the total quantity, is obtained by means of known breaking methods. In this case, the proportion of fragments having a size of less than 10 mm is 2.5 to 5%. In contrast thereto, in the case of breaking the rod-type polycrystalline silicon rods according to the invention, fragments having a size in the range of 50 to 100 mm are increased significantly to greater than 70%, relative to the total quantity. In this case, the proportion of small fragments below 10 mm can be reduced to less than 2%. Given the quantities in industrial production that are customary nowadays, amounting to tens of thousands of tons per year, this means a huge cost saving.

Tools composed of tungsten carbide are generally used in the breaking methods known from the prior art. In this case, the surface of the broken target material is contaminated with 1 to 2 ppbw of tungsten. When the material according to the invention is used, by contrast, the important fragments having a size of 50 to 100 mm have contamination of less than 0.8 ppbw. When breaking tools composed of other materials are used, the contamination by the tool material is likewise significantly reduced. It has thus been found that the average contamination is reduced by at least 20% by the use of the material according to the invention.

It has surprisingly been observed as a further effect of the polycrystalline Si rods according to the invention that these rods tend to fall over to a lesser extent in the reactor. The proportion of Si rods that fell over was able to be reduced by more than 50% in comparison with the prior art. By virtue of the stresses and cracks according to the invention in the Si rods, although the latter can be broken more easily by means of breaking tools, at the same time they have a higher loading stability with respect to falling over while standing in the reactor.

The invention will be explained in greater detail on the basis of the following examples.

The examples were carried out in a Siemens reactor with 8 rods. The thin rods used were composed of ultrapure silicon having a length of 2 m and had a diameter of 5 mm. A mixture of hydrogen and trichlorosilane was used for deposition. The temperature of the rods was 1000° C. during the entire deposition time. The pressure in the reactor was 3 bar. The deposition proceeded until the rods attained a diameter of 160 mm. The power required at the end of the deposition was approximately 25 kW per 1 m rod length.

Comparative Example

After the rods had attained a diameter of 160 mm, the supply of trichlorosilane was ended. Afterward, the reactor was purged using pure hydrogen for 1 hour. The supply of hydrogen was then ended. In this case, the required power was 5 kW per 1 m rod length. The temperature of the rods was then reduced from 1000° C. to 500° C. within one hour and the power supply was subsequently switched off. After cooling of the rods and replacement of the gas in the reaction bell by nitrogen, the deposition reactor was opened and the carrier bodies were removed from the reactor. In a subsequent step, the rods were broken in a targeted manner into pieces having a size of 50 to 100 mm using hammers composed of tungsten carbide. In total, 100 batches were deposited by means of this method. 10% of the rods fell over during cooling and were unusable without subsequent cleaning. A plurality of cross sections were analyzed for each rod. Approximately 30% of the analyzed cross sections had cracks and/or stresses of larger than $1 \cdot 10^{-4}$ cm$^{-1}$. When the rods were broken, approximately 3.5% of the fragments obtained had a size of less than 10 mm. The preferred Si fragments having the target size of 50 to 100 mm were obtained on average in a proportion of 61% and had on average tungsten contamination of 3.4 ppbw.

Example 1

After the rods had attained a diameter of 160 mm, the supply of trichlorosilane was ended. The reactor was subsequently purged using pure hydrogen for 1 hour. Afterward, the hydrogen pressure in the installation was raised to 10 bar and the hydrogen flow rate was raised to 200 Nm$^3$/h. In this case, the required power was 15 kW per 1 m rod length. The temperature of the rods was then reduced from 1000° C. to 500° C. within one hour and the power supply was subsequently switched off. After cooling of the rods and replacement of the gas in the reaction bell by nitrogen, the deposition reactor was opened and the carrier bodies were removed from the reactor. In a subsequent step, the rods were broken in a targeted manner into pieces having a size of 50 to 100 mm using hammers composed of tungsten carbide. In total, 200 batches were deposited by means of this method according to the invention. In contrast to the prior art, only 3% of the rods fell over during cooling. A plurality of cross sections were analyzed for each rod. Approximately 92% of the analyzed cross sections had cracks and/or stresses larger than $1\cdot10^{-4}$ cm$^{-1}$. When the rods were broken, approximately 1.5% of the fragments were obtained with a size of less than 10 mm. The preferred Si fragments having the target size of 50 to 100 mm were obtained on average in a proportion of 77% and had on average tungsten contamination of 0.5 ppbw.

Example 2

After the rods had attained a diameter of 160 mm, the supply of trichlorosilane was ended. The reactor was subsequently purged using pure hydrogen for 1 hour. The hydrogen flow rate was then raised to 200 Nm$^3$/h. The pressure in the installation was set to be equal to the ambient pressure (approximately 1 bar). In this case, the required power was 13 kW per 1 m rod length. The temperature of the rods was then reduced from 1000° C. to 500° C. within one hour and the power supply was subsequently switched off. After cooling of the rods and replacement of the gas in the reaction bell by nitrogen, the deposition reactor was opened and the carrier bodies were removed from the reactor. In a subsequent step, the rods were broken in a targeted manner into pieces having a size of 50 to 100 mm using hammers composed of tungsten carbide. In total, 100 batches were deposited by means of this method according to the invention. In contrast to the prior art, 5% of the rods fell over during cooling. A plurality of cross sections were analyzed for each rod. Approximately 85% of the analyzed cross sections had cracks and/or stresses larger than $1\cdot10^{-4}$ cm$^{-1}$. When the rods were broken approximately 1.8% of the fragments were obtained with a size of less than 10 mm. The preferred Si fragments having the target size of 50 to 100 mm were obtained on average in a proportion of 73% and had on average tungsten contamination of 0.7 ppbw.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A non-quenched polycrystalline silicon rod which is easily comminuted, the silicon rod having a rod diameter of >100 mm, and having been prepared by a process comprising depositing polycrystalline silicon by means of chemical vapor deposition from a silicon-containing gas onto a silicon filament rod according to the Siemens method at a deposition temperature, wherein following the deposition, the polycrystalline Si rods are brought into contact with hydrogen during a cooling phase in the reactor, wherein the hydrogen flow rate and/or the hydrogen pressure is/are selected such that the power for maintaining the deposition temperature at the selected hydrogen flow rate and/or pressure is at least 50% of the power required at the end of deposition, but not less than 5 kW per 1 m rod length, and the cooled polycrystalline Si rods have, in perpendicular cross section, cracks and/or radial stresses of at least $1\cdot10^{-4}$ cm$^{-1}$, the cracks and/or radial stresses existing immediately following removal of the polycrystalline silicon rod from the Siemens reactor without any quenching step, wherein 80% of the cross sections in a perpendicular direction with respect to the thin rod have cracks and/or radial stresses larger than $1\cdot10^{-4}$ cm$^{-1}$.

2. The polycrystalline silicon rod of claim 1, wherein the polycrystalline Si rods are brought into contact with hydrogen during the cooling phase at least to a rod temperature of 800° C.

3. The polycrystalline silicon rod of claim 1, wherein the hydrogen pressure in the reactor is between 2 and 30 bar.

4. The polycrystalline silicon rod of claim 2, wherein the hydrogen pressure in the reactor is between 2 and 30 bar.

5. The polycrystalline silicon rod of claim 1, wherein the hydrogen flow rate is between 2 and 100 Nm$^3$/h per 1 m rod length.

6. The polycrystalline silicon rod of claim 2, wherein the hydrogen flow rate is between 2 and 100 Nm$^3$/h per 1 m rod length.

7. The polycrystalline silicon rod of claim 3, wherein the hydrogen flow rate is between 2 and 100 Nm$^3$/h per 1 m rod length.

8. The polycrystalline silicon rod of claim 4, wherein the hydrogen flow rate is between 2 and 100 Nm$^3$/h per 1 m rod length.

9. The polycrystalline silicon rod of claim 1, which is capable of being broken by tungsten carbide comminution tools to form polycrystalline silicon rod fragments having a tungsten contamination of 0.8 ppb by weight or less.

10. The polysilicon rod of claim 1 in crushed form, wherein the weight percentage of fragments having a size of 50-100 mm is at least 70% and the weight percentage of fragments having a size less than 10 mm is less than 2%.

11. A non-quenched polycrystalline silicon rod which is easily comminuted, the silicon rod having a rod diameter of >100 mm, and having been prepared by a process comprising depositing polycrystalline silicon by means of chemical vapor deposition from a silicon-containing gas onto a silicon filament rod according to the Siemens method at a deposition temperature, wherein following the deposition, the polycrystalline Si rods are brought into contact with hydrogen during a cooling phase in the reactor, wherein the hydrogen flow rate and/or the hydrogen pressure is/are selected such that the power for maintaining the deposition temperature at the selected hydrogen flow rate and/or pressure is at least 50% of the power required at the end of deposition, but not less than 5 kW per 1 m rod length, and the cooled polycrystalline Si rods have, in perpendicular cross section, cracks and/or radial stresses of at least $1\cdot10^{-4}$ cm$^{-1}$, the polycrystalline rod having no fractures induced by quenching.

12. A non-quenched polycrystalline silicon rod which is easily comminuted, the silicon rod having a rod diameter of >100 mm, and having been prepared by a process comprising depositing polycrystalline silicon by means of chemical vapor deposition from a silicon-containing gas onto a silicon filament rod according to the Siemens method at a deposition temperature, wherein following the deposition, the polycrystalline Si rods are brought into contact with hydrogen during a cooling phase in the reactor, wherein the hydrogen flow rate and/or the hydrogen pressure is/are selected such that the power for maintaining the deposition temperature at the selected hydrogen flow rate and/or pressure is at least 50% of the power required at the end of deposition, but not less than 5 kW per 1 m rod length, and the cooled polycrystalline Si rods have, in perpendicular cross section, cracks and/or radial stresses of at least $1\cdot10^{-4}$ cm$^{-1}$, the non-quenched polycrystalline silicon rod being one of a plurality of non-quenched polycrystalline silicon rods contained within the reactor shell of a Siemens reactor.

13. The non-quenched polycrystalline rod of claim 1, which has no cracks, but has radial stresses of $1 \cdot 10^{-4}$ cm$^{-1}$.

\* \* \* \* \*